United States Patent [19]

Satriano

[11] Patent Number: 5,148,264
[45] Date of Patent: Sep. 15, 1992

[54] HIGH CURRENT HERMETIC PACKAGE

[75] Inventor: Robert J. Satriano, Hackettstown, N.J.

[73] Assignee: Harris Semiconductor Patents, Inc., Melbourne, Fla.

[21] Appl. No.: 517,799

[22] Filed: May 2, 1990

[51] Int. Cl.⁵ .............................................. H01L 23/02
[52] U.S. Cl. .......................................... 357/74; 357/80; 357/68
[58] Field of Search ........................ 357/74, 72, 80, 81, 357/68

[56] References Cited

U.S. PATENT DOCUMENTS

| | | | |
|---|---|---|---|
| 2,985,806 | 5/1961 | McMahon, Jr. et al. | 351/74 |
| 2,990,501 | 6/1961 | Cornelison et al. | 317/234 |
| 3,020,454 | 2/1962 | Dixon | 357/81 |
| 3,199,004 | 8/1965 | Dickson | 357/81 |
| 3,662,086 | 5/1972 | Hessinger | 357/81 |
| 3,820,153 | 6/1974 | Quinn | 357/81 |
| 4,009,485 | 2/1977 | Koenig | 357/79 |
| 4,044,374 | 8/1977 | Roberts et al. | 357/74 |
| 4,076,955 | 2/1978 | Gates, Jr. | 174/52 |
| 4,196,444 | 4/1980 | Butner et al. | 357/74 |
| 4,278,990 | 7/1981 | Fichot | 357/74 |
| 4,338,621 | 7/1982 | Braun | 357/74 |
| 4,394,530 | 7/1983 | Kaufman | 357/69 |
| 4,403,243 | 9/1983 | Hakamada | 357/74 |
| 4,412,203 | 10/1983 | Kurtz et al. | 338/4 |
| 4,436,951 | 3/1984 | Riet et al. | 174/52.2 |
| 4,514,587 | 4/1985 | Van Dyk Soerewy | 174/52 |
| 4,560,826 | 12/1985 | Burns et al. | 174/52 |
| 4,646,129 | 2/1987 | Yerman et al. | 357/74 |
| 4,651,192 | 3/1987 | Matsushita et al. | 357/74 |
| 4,675,472 | 6/1987 | Krumme et al. | 357/74 |
| 4,788,626 | 11/1988 | Neidig et al. | 357/81 |
| 4,819,042 | 4/1989 | Kaufman | 357/80 |
| 4,920,405 | 4/1990 | Itoh et al. | 357/74 |

FOREIGN PATENT DOCUMENTS 57-15453  1/1982  Japan ................................. 357/80

Primary Examiner—Andrew J. James
Assistant Examiner—Viet Q. Nguyen
Attorney, Agent, or Firm—Watov & Kipnes

[57] ABSTRACT

A package for a device comprises a header having a substantially flat upper surface. An insulating disk is affixed to the upper surface of the header for having the device mounted thereon. A barrel having upper and lower portions of respectively greater and smaller diameters, and having a step between the diameters, has a lower edge thereof attached to the upper surface of the header so as to surround the disk. A ceramic lid in the upper portion of the barrel abuts the step is attached thereat.

12 Claims, 2 Drawing Sheets

HIGH CURRENT HERMETIC PACKAGE

FIELD OF THE INVENTION

The present invention relates generally to a package for an electronic device, and more particularly to a package for hermetically sealing electronic devices and circuits.

BACKGROUND OF THE INVENTION

It is well known in the art to use packages for enclosing electronic devices, such as semiconductor chips, power semiconductor chips and the like.

Hermetically sealed devices providing connections to the enclosed device are commonly used in the art. A hermetic package arrangement of this type for large scale integrated circuits, or hybrid circuits is disclosed, for example, in U.S. Pat. No. 4,076,955, issued Feb. 28, 1978 to Gates, Jr. A device, such as an integrated circuit wafer, is attached to a base and a sealing ring enclosure surrounding the device is hermetically sealed to the base. The sealing ring has a greater height than the wafer. Above the device, a lid is hermetically sealed to a sealing area provided on the sealing ring. Soldering is used to secure various lid embodiments to areas to be covered and hermetically sealed on the packages. Radial leads with conventional wire bonding are disclosed for providing connections to the device.

A hermetic package for integrated circuits used in high power applications is disclosed in U.S. Pat. No. 4,3398,621, issued Jul. 6, 1982 to Braun. This shows an integrated circuit mounted on a surface of a multilayer ceramic member and wire-bonded to electrically conductive tabs near the periphery of the device. Input-/output pins are provided on the exterior surface of a ceramic lid. The package includes a ceramic base member having an interior recess upon which on integrated circuit is mounted. The plurality of electrically conductive tabs is arranged about the circumference of the integrated circuit, for connection via wires bonded thereto at one end and to contact pads on the planer surface of the ceramic base member. The metallized lines are used to connect the pads to electrically conductive bosses on the exterior surface of the ceramic lid for providing input and output pins. Brazing is used to hermetically seal the input and output pins to the bosses, and solder reflow is used for sealing the base and cover members to each other. Also, solder reflow is used for establishing electrical connections between the die and the pins via the corresponding pads.

An important consideration in the design of a package enclosing a power device is the difference in the temperature coefficient of expansion of different materials that may be utilized in adjacent parts in such a package. Problems caused by such differences are alleviated by utilizing materials having temperature coefficients as well matched as possible. Thus, U.S. Pat. No. 4,646,129 issued Feb. 24, 1987 to Yerman et al., for example, discloses a hermetic package including a gasket with a temperature coefficient close to that of a dielectric plate of the hermetic package. The dielectric plate has transistor electrodes on the underside thereof. Electrical access to these electrodes is provided from the top side of the dielectric plate by corresponding leads which are connected via conducting-through holes in the dielectric plate.

U.S. Pat. No. 4,651,192 issued on Mar. 17, 1987, to Matsushita et al. discloses a ceramic package for a semiconductor integrated circuit device. The package includes an insulating substrate fabricated from a ceramic material, upon which is mounted one or more integrated circuits. An alumina ceramic cap is bonded to the ceramic substrate via a solder glass layer, for forming a hermetically sealed package. Terminals for providing electrical connections to the package are sandwiched between the cap and substrate, whereby interior ends of the terminals are electrically connected to the integrated circuit, with the other ends of the terminals being external to the package for providing signal and power connections. The particular ceramic materials used are specifically disclosed for providing very closely matched coefficients of thermal expansion.

Various other package arrangements are disclosed, for example, in U.S. Pat. No. 2,990,501 issued Jun. 27, 1961 to Cornelison et al.; U.S. Pat. No. 4,514,587 issued Apr. 30, 1985 to Van Dyk Soerewyn; and U.S. Pat. No. 4,560,826 issued Dec. 24, 1985 to Burns et al. Cornelison et al. discloses the use of a housing, including a dish-shaped metal header assembly in a lower portion, electrical leads having portions of the lead outside of the housing, and portions within the interior thereof for making electrical connection to a semiconductor element. Insulating material fills the lower portion of the header assembly for electrically isolating the leads from the metal header. The portions of the leads protruding from the housing are soldered to eyelets, for making electrical connections to printed circuit pads of a substrate. Cornelison et al. also discloses that the lower metal shell can be formed from a ceramic or glass disc with a metallic ring thereabout for bonding the housing to the disc. Van Dyk Soerewyn discloses a power semiconductor package in a top-hat configuration, that includes an encapsulant within the cylindrical section of the enclosure about the integrated circuit assemblies mounted therein. Burns et al. discloses a hermetically sealed package for an integrated circuit (IC). The package includes the mounting of an integrated circuit on a substrate with all electrical connections to the IC made on top of the substrate to vias. The opposite side of the substrate includes leads electrically connected to leads on the opposite side for providing signal and power connections to the package. In this regard, a pedestal is included for electrically interconnecting the inner and outer leads. A sealing ring is provided about the circumference of the area in which the integrated circuit is mounted, for sealing to a ceramic cap via a sealing skirt about the circumference of the bottom edge of the cap.

It is herein recognized that the use of, for example, aluminum wire bonds for providing connections between a device, such as an IC chip in the package and outside circuitry may require that the metallization on the chip be preferably aluminum and that such a restriction may be undesirable. Furthermore, the use of wire bonds tends to introduce a relatively high parasitic inductance in the connection. It is herein also recognized that connections utilizing straps are preferable in this regard, and that top-side connection to a device is desirable. However, it is also desirable that, in meeting such requirements, the package profile be kept low and that, in so far as is possible, conventional manufacturing processes be utilizable.

SUMMARY OF THE INVENTION

It is a goal of the invention to achieve a device package wherein closely matched thermal coefficients of expansion are utilized while providing for good heat dissipation capability. It is another goal of the invention to achieve high current carrying capacity in the connections to a device hermetically contained in the package. It is a further goal of the invention to provide internal electrical isolation within the package. Another goal of the invention is to achieve the foregoing goals in a package that is of light weight and has a small profile In accordance with one embodiment of the invention, a package for a device, comprises a header having a substantially flat upper surface. An insulating disk is affixed to the upper surface of the header for having the device mounted thereon. A barrel having upper and lower portions of respectively greater and smaller diameters and having a step between the diameters, has a lower edge thereof attached to the upper surface of the header so as to surround the disk. A ceramic lid in the upper portion of the barrel abuts the step and is attached thereat.

In accordance with another embodiment of the invention, a package for hermetically sealing an electronic device, comprises a metal header having an under surface adapted for attachment to a mounting surface and having a substantially flat upper surface. An insulating disk is affixed to the upper surface of the header, the disk being adapted for having the electronic device affixed thereupon. A barrel, having upper and lower generally cylindrical portions of respectively greater and smaller diameters, has a diameter step therebetween, a lower edge of the barrel being attached to the upper surface of the header so as to contain the insulating disk within the lower portion of the barrel. A ceramic lid is attached within the upper portion of the barrel so as to abut the diameter step.

In accordance with another embodiment of the invention, an insulating disk affixed to the upper surface of the header has a conductive pattern formed thereon for mounting lead connections for the electronic device. A ceramic lid is hermetically attached within the upper portion of the barrel so as to abut the diameter step, the lid having a hole pattern therein for passing therethrough the lead connections of the electronic device. In accordance with still another embodiment of the invention, a package for hermetically sealing an electronic device, includes an electronic device mounted on the insulating disk.

BRIEF DESCRIPTION OF THE DRAWING

The invention will be more fully understood from the following detailed description of the preferred embodiments of the invention, in conjunction with the drawing, in which like items are identified by the same reference designation, whereon.

DETAILED DESCRIPTION OF THE PREFERRED EMBODIMENTS OF THE INVENTION

Figure 1:
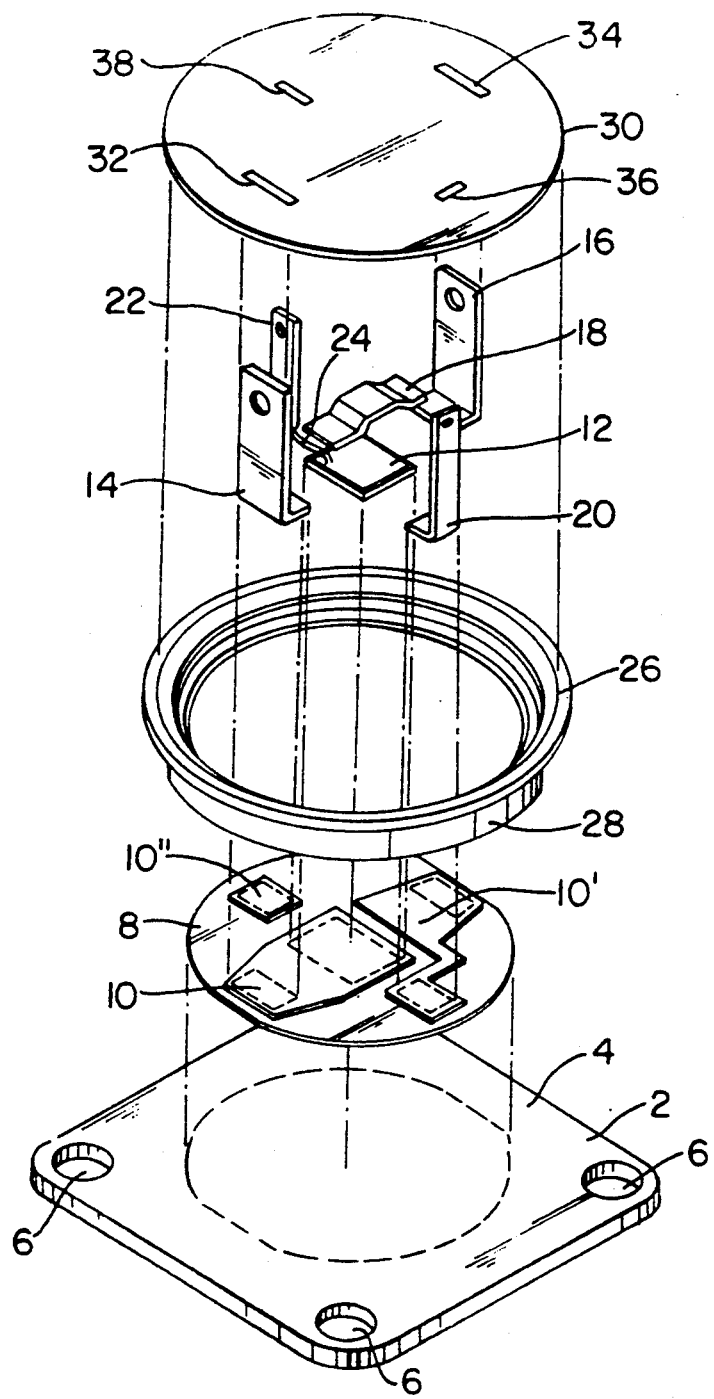
FIG. 1 shows an exploded assembly view, in isometric projection, of one embodiment of the invention.

As shown in FIG. 1, a metallic header or base portion 2 has a generally flat upper surface 4 and a bottom or under surface adapted for being attached to a mounting surface. Holes 6 are provided for fastening by means of screws, rivets, or other fasteners. A ceramic isolation disk 8 is attached to upper surface 4 of header 2. Ceramic isolation disk 8 has conductive patterns 10, 10', 10" formed thereon for having attached thereto an electronic device or circuit, such as a power device chip, and various leads for providing electrical connections to the device by way of the conductive patterns. In the present exemplary embodiment, the device is a power transistor formed in a silicon semiconductor die 12. Connection to the electrodes of semiconductor die 12 is provided by flat leads for low inductance, high current carrying capacity, and desirable physical ruggedness. Thus, a drain lead 14 is attached directly to conductive pattern 10 for thereby electrically contacting the drain electrode of die 12 A source lead 16 is attached to conductive pattern 10', for thereby contacting the source electrode by way of a source strap 18, which bridges from source lead 16 to the source contact pad on the die. In order to solder strap 18 to the source contact pad, it is desirable to place gold balls on the contact pad on the die to facilitate soldering between nickel plated copper and gold.

In operation, lead 14 and source strap 16 carry the main conduction path current and are therefore of a substantial cross-section for low voltage drop under heavy current conditions and have low inductance. Nevertheless, some voltage drop will inevitably occur, including a voltage drop in metallization pattern 10'. It may sometimes be important to avoid undesirable electrical feedback effects caused by such voltage drops and to that end, a further source lead is provided as a sensing or Kelvin lead 20 which provides a connection to a point in the source circuit which does not include a portion of the voltage drop occurring in the source lead. The gate electrode of semiconductor die 12 is required to carry currents that are very small in comparison with the main source/drain current and consequently, it is adequate to make the connection between a gate lead 22 and the gate electrode contact pad on the die by way of an aluminum bond wire 24.

A metallic barrel portion 26, generally tubular in form, is attached at its lower edge to top surface 4 of header 2. The diameter of the opening at the bottom of barrel portion 26 is such as to fit around ceramic isolation disk 8. Barrel portion 26 has a lower portion 28 that is generally cylindrical and an upper portion that is stepped in its circumference at a shoulder 29 so that the diameter of the opening at the top of barrel 26 is larger than the opening at the bottom. The diameter of the opening at the top of barrel portion 26 is such as to allow a fit around a ceramic lid 30 which abuts shoulder 29 in barrel portion 26. Ceramic lid 30 has therein openings or lead slots 32, 34, 36, and 38 for allowing drain lead 14, source lead 16, Kelvin lead 20, and gate lead 22 to pass through and protrude beyond the upper surface of ceramic lid 30 for allowing connections to be made thereto to external circuitry.

Figure 2:
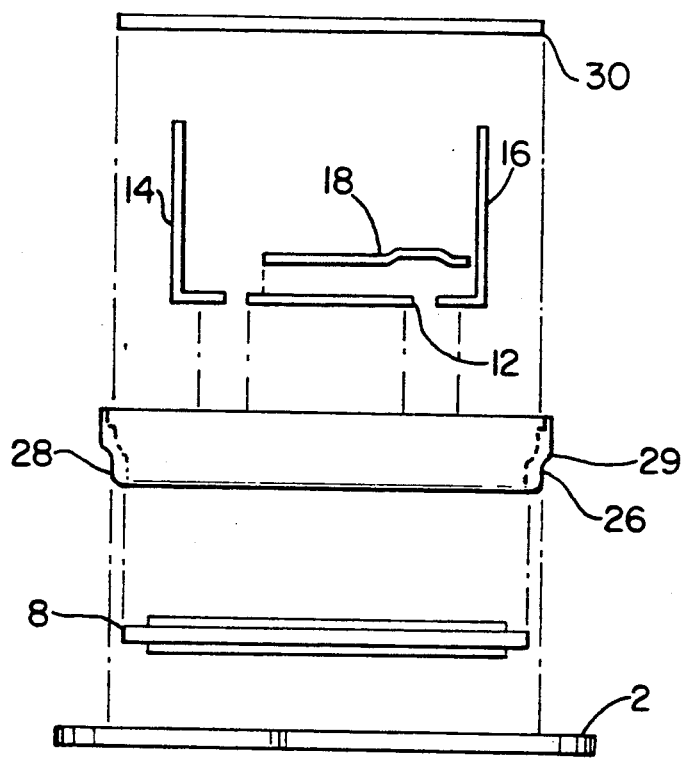
FIG. 2 shows a exploded view in a side elevation of the embodiment of the invention of FIG. 1.

FIG. 2 will be helpful in further clarifying the arrangement of the parts and in illustrating shoulder 29 in barrel portion 26.

While various choices of materials are possible, in the present exemplary embodiment, header 2 is preferably made of a clad system such as a copper-molybdenum-copper clad or copper-invar-copper clad having a total thickness in the order of 0.05 inch. In this manner, high thermal conductivity is obtained together with mechanical strength for mounting. Good matching of thermal coefficients of expansion provides resistance to fatigue related damage as may result from thermal cycling.

Ceramic isolation disk 8 is preferably fabricated from beryllium oxide of about 0.030 inch thickness and is direct bonded with copper on each side of about 0.010 inch thickness. The top copper layer is then etched to form conductive patterns 10, 10', and 10". High thermal conductivity and high breakdown voltage are exhibited by this material combination. The thermal coefficient of expansion is in the order of 8 parts per million per degree Celsius.

Barrel portion 26 is preferably made from 0.030 inch thick 1020 steel using a stamp, coin, and pierce procedure. Such a procedure results in an inexpensive, lightweight structure having a thermal coefficient of expansion of about 12 parts per million per degree Celsius.

Drain lead 14, source lead 16, Kelvin lead 20, gate lead 22, and strap lead 18 are cut and formed from 0.025 inch CDA 102 copper. This material lends itself readily to being formed and provides high current carrying capacity at low cost. The thermal coefficient of expansion is about 16 parts per million per degree Celsius.

Ceramic lid 30 is preferably fabricated from pressed and sintered Forsterite TM. Only the outer circumference of lid 30 and lead slots 32, 34, 36, and 38 are metalized with lithium molybdate, and thereafter are nickel-plated for solderability. Thus, the non-metallized parts of ceramic lid 30 provide electrical isolation between leads. Forsterite TM exhibits a thermal coefficient of expansion of about 10 parts per million per degree Celsius.

In assembling the package, header 2, ceramic isolation disk 8, barrel portion 26, drain lead 14, source lead 16, Kelvin lead 20, and gate lead 22 are mated together, fixtured and brazed using a silver/copper braze alloy. The assembly is then electroless nickel plated for corrosion resistance and solderability.

Silicon die 12 and source strap 18 are then mounted in the package using solder alloy preforms, then reflowed in a hydrogen/nitrogen forming gas atmosphere.

Gate bond wire 24 is preferably a 5 mil (0.005 inch) aluminum wire ultrasonically bonded from gate lead 22 to the gate electrode contact pad on die 12.

Ceramic lid 30 is slid over drain lead 14, source lead 16, Kelvin lead 20, and gate lead 22 and into barrel portion 26. Solder alloy wire preforms are put in place and reflowed in a forming gas atmosphere so as to result in solder joints that form a hermetic seal around lid 30 and drain lead 14, source lead 16, Kelvin lead 20, and gate lead 22.

Figure 3:
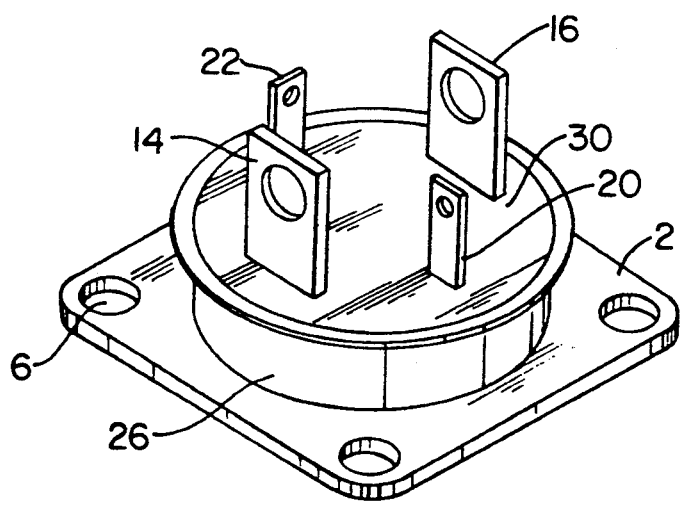
FIG. 3 shows an outside view, in isometric projection of the embodiment of the invention.

FIG. 3 shows the exemplatory assembled package. The assembled profile height is typically under 0.25 inch and the weight under 25 grams. Current carrying capacity is in the order of 100 Amperes and the voltage breakdown is in order of 1000 Volts.

While the invention has been described by way of exemplatory embodiments, various changes will be apparent to one skilled in the art which do not depart from the spirit and scope of the invention, and which are meant to be covered by the following claims.

I claim:

1. A package for hermetically sealing an electron device, comprising:
    a metal header made of copper and having a substantially flat under surface and a substantially flat upper surface;
    an insulating disk of beryllium oxide affixed to said upper surface of said header by brazing, said insulating disk having conductive patterns of copper formed on the upper side thereof for mounting said electronic device and connection leads for said electronic device;
    flat connection leads respectively brazed to said conductive pattern;
    a steel barrel having upper and lower generally cylindrical portions of respectively greater and smaller internal diameters and having a circumferential step therebetween forming a shoulder, a over edge of the lower portion of said barrel being attached to said upper surface of said header by brazing so as to form a hermetic seal therewith and so as to surround and contain said insulating disk within said lower portion of said barrel;
    a ceramic lid having a diameter slightly less than that of said upper portion, hermetically sealed to said shoulder via said ceramic lid having a circumference plated with nickel plated lithium molybdate and being attached by soldering at said circumference to said barrel, said ceramic lid having slots therein through which said connection leads pass, said slots being peripherally plated with nickel plated lithium molybdate and being respectively soldered to said leads to form a hermetic seal therewith; and
    said electronic device being mounted on said conductive pattern of copper on said insulating disk.

2. A package as recited in claim 1, wherein said header is a clad of copper, molybdenum and cooper.

3. A package as recited in claim 1, wherein said header is a clad of copper, invar, and copper.

4. A package for hermetically sealing an electronic device comprising:
    a metal header adapted for attachment to a mounting surface, said header having a flat uniform top mounting surface;
    an insulating is affixed to the top mounting surface of said header, said disk having separate conductive patterns thereon;
    connection leads conductively attached to respective ones of said conductive patterns;
    a die having opposed planar conductive surfaces, one of said surfaces being conductively attached to one of said conductive patterns;
    a conductive strap having one end conductively attached to the other surface of said die and its other end conductively attached to a conductive pattern other than the one to which said die is attached;
    a barrel having upper and lower generally cylindrical portions of respectively greater and smaller diameters having a circumferential step therebetween forming a shoulder;
    means hermetically sealing a lower edge of said barrel to said header so as to surround said insulating disk;
    a flat ceramic lid hermetically sealed to said shoulder formed by said circumferential step of said barrel, said lid having a relatively thin disk shape and slots through which said leads respectively pass; and
    means hermetically sealing said leads to their respective slots.

5. A package as recited in claim 4, wherein said header is made of copper, said ceramic disk is made of beryllium oxide, and said barrel is made of steel.

6. A package as set forth in claim 5 wherein the hermetic sealing of said lid to said shoulder and said leads to said slots is comprised of metallization with nickel plated lithium molybdate and solder.

7. A package for a device comprising:

a solid header having a base with a flat top surface, and flat bottom surface;

a barrel attached to said top surface; said barrel having upper and lower generally cylindrical portions of respectively greater and smaller diameters having a circumferential step therebetween forming a shoulder;

a ceramic isolation disk attached to said top surface and within said barrel;

first and second isolated conductive patterns formed on said ceramic disk;

a die having opposed planar conductive electrode surfaces, one surface being in contact with said first conductive pattern;

a first flat lead conductively attached to said first conductive pattern in an area outside said die and extending upwardly therefrom;

a second flat lead electrically and mechanically attached to said second conductive pattern and extending upward therefrom;

a flat metal strap having one end of one surface electrically connected to said second conductive pattern and the outer end of said one surface electrically connected to the other surface of said die;

a ceramic lid attached to said shoulder formed by said circumferential step of said barrel so as to enclose said die, said lid having a relatively thin disk shape and slots through which said first and second leads extend;

means hermetically sealing said lid to said barrel; and means hermetically sealing said first and second flat leads in said slots.

8. A package as set forth in claim 7 wherein said base is made of copper, said isolation disk is made of beryllium oxide bonded with copper, and said barrel is made of steel.

9. A package as set forth in claim 7 wherein said means for hermetically sealing said lid to said barrel and said leads to said slots comprises metallization with nickel plated lithium molybdate.

10. A package as set forth in claim 7 further comprising means forming a recessed shoulder within and below the top of said barrel to which said lid is attached.

11. A package as set forth in claim 7 further comprising:

a third conductive pattern formed on said disk;

a third lead conductively attached to said third conductive pattern;

said planar conductive electrode surfaces being respectively source and drain electrodes of said die;

said die having a gate electrode; and an electrical connection between said third conductive pattern and said gate electrode.

12. A package as set forth in claim 11 further comprising:

a fourth lead electrically and mechanically attached to said second conductive pattern;

a slot in said lid through which said fourth lead passes; and means heretically sealing said fourth lead to said last mentioned slot in said ceramic lid.

* * * * *

UNITED STATES PATENT AND TRADEMARK OFFICE
CERTIFICATE OF CORRECTION

PATENT NO. : 5,148,264
DATED : September 15, 1992
INVENTOR(S) : Robert J. Satriano It is certified that error appears in the above-indentified patent and that said Letters Patent is hereby corrected as shown below:

Column 1, line 37, change "on" to --an--.

Column 5, line 60, change "electron" to --electronic--.

Column 6, line 8, change "over" to --lower--;
line 28, change "cooper" to --copper--; and
line 36, change "is" to --disk--.

Column 7, line 24, change "outer" to --other--.

Column 8, line 10, after "molybdate" insert --and solder--; and
line 30, change "heretically" to --hermetically--.

Signed and Sealed this

Twelfth Day of October, 1993

Attest:

Attesting Officer

BRUCE LEHMAN
Commissioner of Patents and Trademarks